(12) United States Patent
Kraft et al.

(10) Patent No.: US 6,635,510 B1
(45) Date of Patent: Oct. 21, 2003

(54) METHOD OF MAKING A PARYLENE COATING FOR SOLDERMASK

(75) Inventors: Philip Paul Kraft, Warminster, PA (US); Steven C. Deffler, Medford, NJ (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 10/153,372

(22) Filed: May 22, 2002

(51) Int. Cl.[7] .............................................. H01L 21/44
(52) U.S. Cl. ........................ 438/107; 438/110; 438/129; 438/598; 438/599; 438/612; 438/613; 438/618
(58) Field of Search ................................ 438/107–108, 438/110, 112, 114, 119, 125–127, 129, 598–599, 612–613, 618

(56) References Cited

U.S. PATENT DOCUMENTS 5,373,627 A * 12/1994 Grebe ......................... 438/107
6,184,121 B1 * 2/2001 Buchwalter et al. ........ 438/618
6,255,137 B1    7/2001 Gorczyca et al. ........... 438/112

* cited by examiner

*Primary Examiner*—John F. Niebling
*Assistant Examiner*—Lynne A. Gurley
(74) *Attorney, Agent, or Firm*—Duane Morris LLP

(57) ABSTRACT

A method for making an HDI circuit including backside connections uses parylene as a protective coating. The method includes the steps of: procuring an insulating substrate including an active chip which has exposed electrical or thermal connection(s) on the rear surface thereof, applying a parylene coating to the exposed connections to protect the connections; performing additional HDI interconnect processing steps as desired on the front surface of the substrate; selectively removing a portion of the parylene coating to expose at least a portion of a connection; and making electrical connection to the exposed backside connections by application of a conductive material in its liquid state to the removed regions. The parylene coating is removed by an excimer laser. The step of making electrical connection to the backside electrical connections may be performed by application of solder, or conductive epoxy in its liquid state.

7 Claims, 4 Drawing Sheets

METHOD OF MAKING A PARYLENE COATING FOR SOLDERMASK

FIELD OF THE INVENTION

This invention relates to methods for fabrication of High Density Interconnect (HDI) circuits, and more particularly, to such methods for making an HDI circuit including rear surface (backside) connections by using parylene both as a protective coating and as a mask.

BACKGROUND OF THE INVENTION

In general, HDI structures allow the interconnection of relatively large numbers of integrated-circuit chips into complex systems in a cost-effective manner. HDI circuits are formed by mounting two or more semiconductor or solid state chips with electrodes or bonding pad sites so that those surfaces of the chip having electrodes are coplanar on a layer of transparent dielectric material, for example, polyimide. The electrode or bonding pad site is disposed adjacent the dielectric material. The opposite side of the chip may also include a rear surface (backside) connection. Thereafter, a laser is optically aligned to the position of each chip at the locations of the electrode to drill through via holes through the dielectric material. An interconnect or metallization layer(s), with a first layer possibly including titanium and a second layer including copper, is then deposited over the polyimide layer and extends into the via holes to make electrical contact to the electrode or pad disposed thereunder. The metallization layer may be patterned to form individual conductors during the deposition process or may be deposited as a continuous layer, and then patterned using photoresist and etching. Additional dielectric layers for isolation between the first metallization layer and subsequent metallization layers may be added to the substrate.

As mentioned, some chips used in an HDI context have rear-surface connections as well as front-surface connections. The rear surface connections may be used for electrical or thermal conduction, or both. The processing of HDI structures for applying the front side interconnects often involves vacuum processes, lasering, and harsh or corrosive chemicals which may adversely affect the backside connections.

Methods for providing protection to the backsides of HDI structures and printed circuit boards from the harsh chemicals involved in processing the structures was provided in the prior art by application of plater's tape onto the metallized back of the process carrier prior to processing. The protective plater's tape must subsequently be removed prior to vacuum processes, including sputter reactive ion etching (RIE), to prevent outgassing. In a multi-layer module manufacturing process, the taping and untaping process can be repeated as many as forty times. The repetition of these taping and untaping steps is expensive, and can result in handling and particulate damage to the HDI interconnect circuitry. In addition to the added labor costs, the seal formed by the plater's tape may not be perfectly effective in preventing leaks through which chemicals may enter and adversely affect the circuitry.

Improved HDI manufacturing is desired.

SUMMARY OF THE INVENTION

Briefly described, a method for making an HDI circuit including backside connections by using parylene as a protective coating includes the steps of: procuring an insulating substrate defining front and rear surfaces and including an active chip essentially coplanar with the insulating substrate, which active chip has electrical connections on a front surface of the chip facing the rear surface of the substrate and which also has at least one of a thermal and electrical connection exposed on a rear surface of the chip, applying a parylene coating to the at least one connection on the rear surface of the chip, to thereby protect the at least one connection; performing additional HDI interconnect processing steps on the front surface of the substrate, including at least via forming, patterning, and metal deposition, which in the absence of the parylene coating may adversely affect the at least one connection; after the step of performing additional HDI front surface interconnect processing steps, selectively removing a portion of the parylene coating in the region of the at least one connection to thereby expose at least a portion of the at least one connection in a selected connection region; and making electrical connection to the at least one connection by application of a conductive material in its liquid state to the selected region, whereby the parylene coating limits the application of the conductive material to the exposed region. The step of making electrical connection to the at least one connection is performed by application of solder or conductive epoxy in its liquid state. The step of selectively removing a portion of the parylene coating is performed by a scanned laser, and more particularly, a KrF excimer laser. The parylene coating may comprise monochloropolyparaxylylene.

DESCRIPTION OF THE INVENTION

Figure 1A:
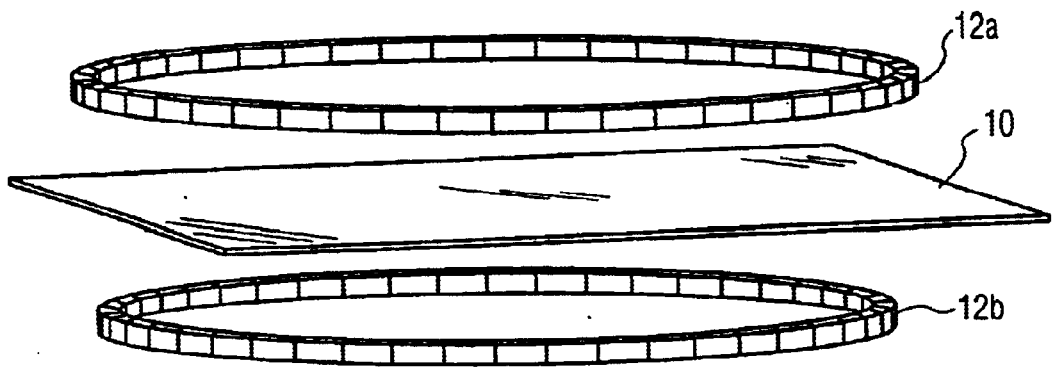
FIG. 1a is a simplified illustration of a dielectric film and a pair of snap rings.
Figure 1B:
FIG. 1b is a simplified representation of the snap rings and film conjoined.

In FIG. 1a, a layer 10 of dielectric film is illustrated as being spaced apart from an upper large snap ring 12a and a lower smaller snap ring 12b. In FIG. 1b, dielectric film layer 10 is held under tension by the conjoined pair 12 of interlocked snap rings 12a and 12b, as though it were a drumskin. The dielectric film layer 10 may be patterned on either (or both) side(s) with a layer of the interconnect circuitry, or may contain fiducial markings (not shown) indicating the locations at which the various components are to be placed. The film most used at this time is KAPTON® brand polyimide film. KAPTON® is a registered trademark of E. I. du Pont de Nemours and Company, and the film may be obtained from DuPont High Performance Materials in Circleville, Ohio. The thickness of the KAPTON® film is approximately 0.0005–0.003 inches (approx. 12.5–75 microns), and may be pretreated by reactive ion etching (RIE) to promote adhesion.

Figure 2A:
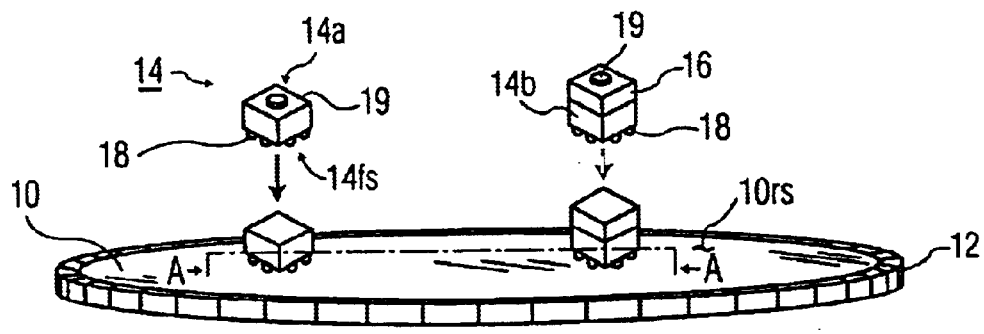
FIG. 2a is a perspective view of the dielectric film of FIG. 1b, with active chips disposed thereon.
Figure 2B:
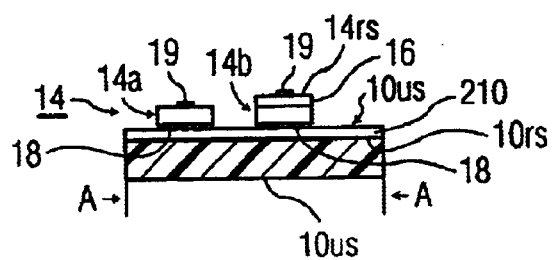
FIG. 2b is a cross sectional view of the dielectric film of FIG. 2a taken along lines A—A.

In FIG. 2a, a layer of adhesive is applied to the rear surface 10rs of layer 10 to thereby form an adhesive-coated film layer 210, illustrated in cross section in FIG. 2b. The adhesive material is preferably a blend of about 100 parts by weight of Shipley MP9500 photosensitive adhesive with 11 parts by weight of Ciba-Geigy CY184 cycloaliphatic epoxy. The adhesive may be applied by deposition upon the framed dielectric film 10, as described in U.S. Pat. No. 6,255,137 to Gorczyca, assigned to the assignee herein, the entire disclosure of which is hereby incorporated by reference.

In FIG. 2b, a set 14 of active semiconductor or solid state chips 14a, 14b is placed onto the surface of the coated dielectric film layer 210 at one or more selected location(s), with the electrical connection or electrode 18 of the chips 14a, 14b on a front surface 14fs thereof facing the adhesive coated film 210. A chip of set 14, such as chip 14b, may optionally be fitted with a shim 16 consisting of a thermal or electrical conducting block bonded to the rear surface 14rs of the chip 14b. The electrodes 18 of the chips are used for electrically connecting one chip with another chip of the HDI module. Each chip of set 14 including electrical connections 18 is substantially coplanar with the film layer 210. Connections 19, whether provided for electrical or thermal contact, or both, are exposed on the backside 14rs of the chips. Although the connections 19 are illustrated as an oval or ellipse in FIG. 2b, it is to be understood that the electrical or thermal connections 19 typically extend along the surface 14rs of the chips 14.

Although two active chips 14a and 14b are illustrated in FIG. 2a, there may be fewer or additional chips disposed onto the coated film layer 210, depending upon the application desired. The multichip assembly 200 typically includes a plurality of chips 14. The number of chips or sets 14 that may be disposed in a module depends on the chip size, as known to those skilled in the art. Set of chips 14 are typically disposed in an array associated with a module, which, in turn, may be associated with an array of modules.

Figure 3A:
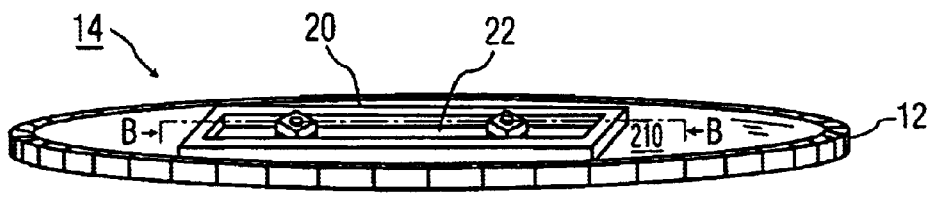
FIG. 3a is a perspective view of the dielectric film of FIG. 2b, with a dam disposed thereon.

After bonding the chips of set 14 to the film 210, one or more module region(s) is defined on surface 210. As illustrated in FIG. 3a, a high viscosity liquid dam material is dispensed around those components included within a single module to thereby form a dam, as described in co-pending application Ser. No. 10/067,077, filed on Feb. 4, 2002, titled Fabrication of Plastic Module with Exposed Backside Contact and assigned to the assignee herein, the entire disclosure of which is hereby incorporated by reference.

Figure 3B:
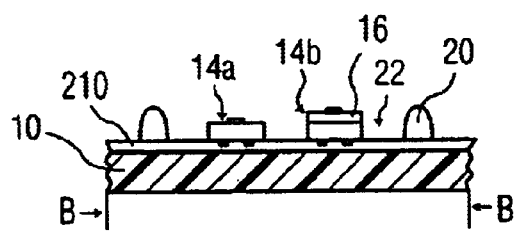
FIG. 3b is a cross sectional view of FIG. 3a taken along lines B—B.

FIG. 3b is a cross sectional view further illustrating the dam 20 surrounding the chips of set 14, and defining a region 22. The presence of dam 20 avoids the tendency to distort occasioned by chip-on flex fabrication. Although one dam 20 defining a single region 22 is illustrated in FIGS. 3a and 3b, more than one region 22 may be formed. It is to be understood that if more than one dam 20 is defined on the coated layer 210, the dams do not contact with each other, as each region 22 so defined may be associated with a single multichip module.

Figure 4A:
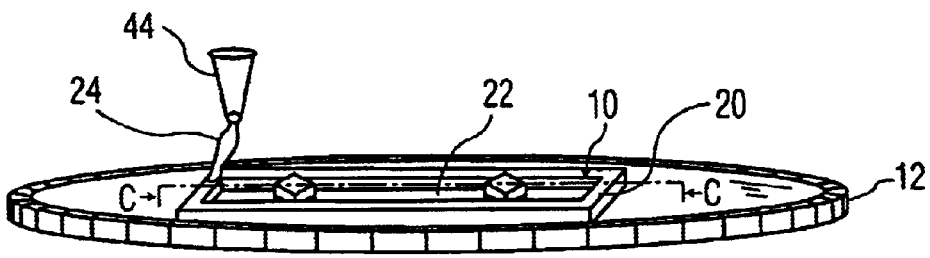
FIG. 4a is a perspective view illustrating the placement of encapsulant material within the region defined by the dam.
Figure 4B:
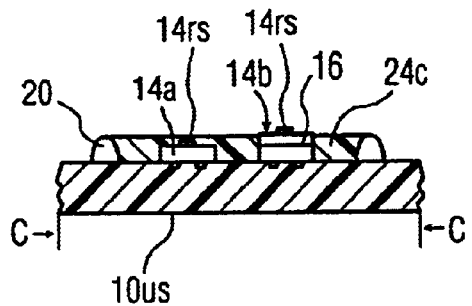
FIG. 4b is a cross sectional view of FIG. 4a taken along lines C—C illustrating the encapsulant material contained within the region defined by the dam.

Referring to FIG. 4a, according to an aspect of the invention, the region 22 defined by the dam 20 is filled with a granular encapsulant dielectric material 24, curable by heating, as described in the aforementioned patent application The region 22 may be filled using a nozzle, designated as 44. The encapsulant material 24, upon the application of heat, melts and cures. A suitable encapsulant material 24 may be a liquid epoxy polymer such as HYSOL FP4651 manufactured by Dexter Corporation of Windsor, Conn. The material dispensed to define the dam(s) 20 may be similar to the encapsulant material 24, but the dam material 20 should have a higher viscosity in its uncured state to limit the flow of encapsulant material 24 in its uncured state. For example, HYSOL FP4452 has a higher viscosity than HYSOL FP4651, and is suitable for use as a dam material 20 in conjunction with using HYSOL FP4651 as encapsulant material 24. FIG. 4b illustrates, in cross section, the cured encapsulant material 24c disposed within the region 22 defined by the dam material 20. Note that chip 14a is completely encapsulated by the encapsulant material 24c, while the backside 14rs of chip 14b is exposed.

Figure 5:
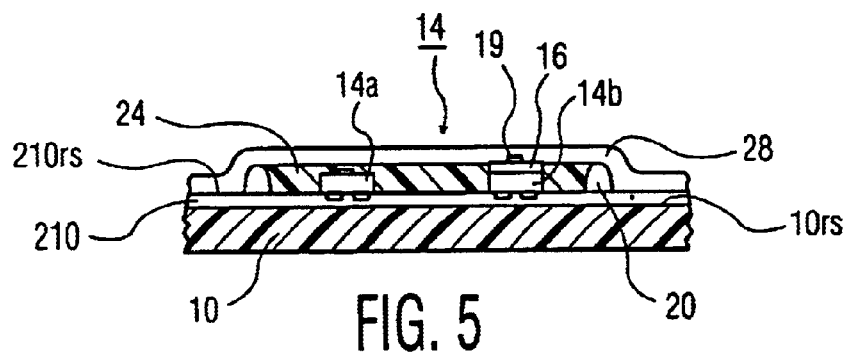
FIG. 5 is a cross sectional view of FIG. 4b illustrating a layer of parylene disposed onto the surface of the encapsulant material, the exposed chip, the dam, and the dielectric film of FIG. 4b.

As illustrated in FIG. 5, a layer 28 of parylene is deposited onto at least the rear surface 210rs of layer 210 and onto the exposed connection(s) 19 on the rear surface of a chip (14a, 14b) of set 14. Parylene is a conformal protective polymer coating material that exhibits the electrical properties of high dielectric strength, high surface resistivity, and high volume resistivity. The electrical properties are essentially independent of temperature. The parylene is deposited at room temperature, at approximately a thickness of 1 mil to thereby form a coating. The deposition process takes place as the chemical, in dimer form (polymer formed from two molecules of a monomer), is converted under vacuum and heat to dimeric gas, pyrolized to cleave the dimer, and finally deposited as a clear polymer film.

The layer 28 of parylene in FIG. 5 also extends over the encapsulant material 24 and the dam 20. The layer 28 of parylene protects the exposed connection(s) 19 from harsh processing chemicals used in HDI interconnect processing, and also serves as a mask as described below. Without the protective layer 28 of parylene, any exposed electrical connections or metallizations might be adversely affected by the subsequent HDI processing steps, particularly those involving wet chemical processes. As is apparent to those skilled in the art, HDI vias and further HDI processes may be performed prior to depositing the layer 28 of parylene. Preferably, however, the layer 28 is deposited prior to all HDI processing steps so as to protect the backside of the HDI module.

Three types of parylene are known, namely, parylene C, N and D. In one mode of the methods according to the invention, paraylene C is employed. Parylene N and D may also be suitable for use in the methods of the invention. Parylene C is also referred to as monochloropolyparaxylylene, parylene N is referred to as polyparaxylylene, and parylene D is referred to as dichloropolyparaxylylene. Parylene is presently manufactured by Union Carbide in Delaware, and is available through Advanced Coating, Rancho Cucamonga, Calif.

Figure 6:
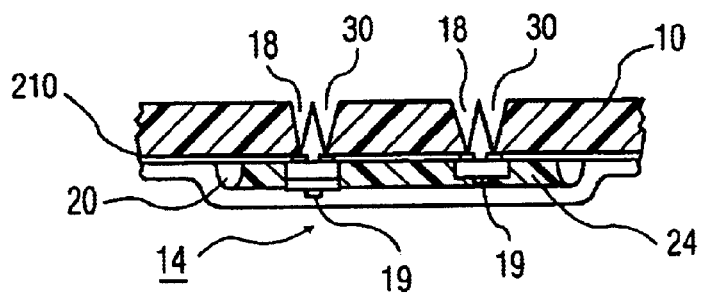
FIG. 6 is a cross sectional inverted view of FIG. 5, illustrating the HDI vias formed through the dielectric layer.

As illustrated in FIG. 6, the structure has been turned over relative to the position illustrated in FIG. 5, so that the parylene coating is facing downward, and the dielectric film layer is facing upward, ready for HDI processing. Through or via holes 30 are formed by laser drilling through the dielectric film layer 10 and adhesive layer 210 at selected locations to expose at least a portion of the electrodes 18 of the chips of set 14, after the conformal layer 28 of parylene has been deposited onto the surface 210rs as described above. During the formation of the HDI vias 30, soot and other particulate matter is generated. The layer 28 of parylene protects any metallized areas from deposition of soot and particles, and also from damage due to the HDI processing chemistry.

Figure 7A:
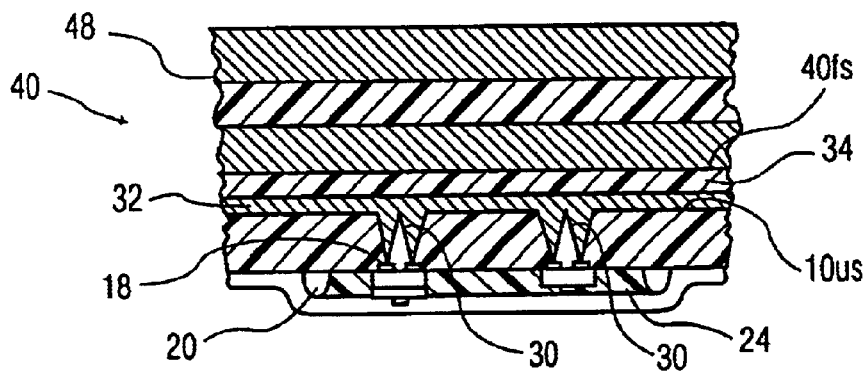
FIG. 7a is a cross sectional view of FIG. 6 illustrating further processing steps associated with forming an HDI circuit.

After the formation of the HDI vias 30, further HDI processing steps may be performed as illustrated in FIG. 7a. For example, a metallization or conductive layer 32 may be added onto front or upper surface 10us of the film 10, followed by a step of coating the conductive layer 32 with a resist 34, also illustrated in FIG. 7a. The metallization layer(s) 32 may include a first layer of titanium and a second layer of copper. The metallization layer may be patterned to form individual or separate conductors, or may be deposited as a continuous layer and then patterned using photoresist and etching, which techniques are known to those skilled in the art. This completes a primitive HDI circuit having a front surface facing upward. Many additional layers 48 may be added to the front surface 40fs of the HDI circuit 40, as is known to those skilled in the art.

Figure 7B:
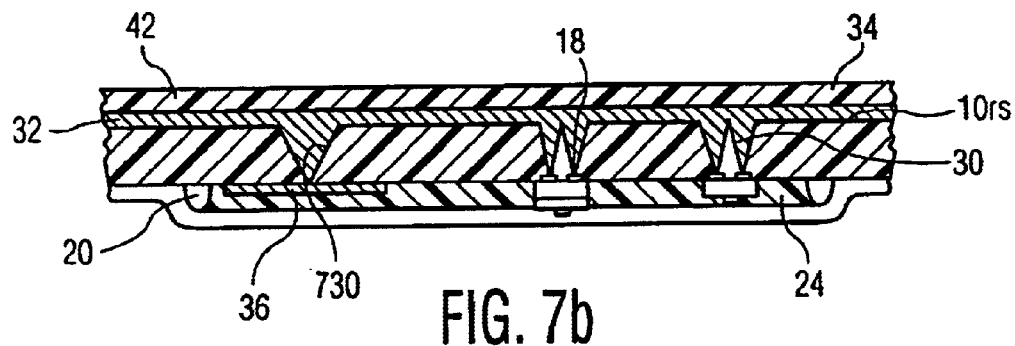
FIG. 7b is a cross sectional view of FIG. 6 illustrating an alternative embodiment according to an aspect of the invention.

The conductive layer(s) 32 extending into the laser-drilled HDI vias 30 makes a connection of the conductive layer(s) 32 to the electrodes 18, as illustrated in FIG. 7a. In an alternative embodiment of FIG. 7b, the HDI processing may include a through via 730 for connection to a ground plane 36, in addition to a connection to the electrode(s) 18. Thereafter, additional HDI vias may be formed, and the HDI connection process may be repeated to form additional layers 48 (FIG. 7a).

Figure 8:
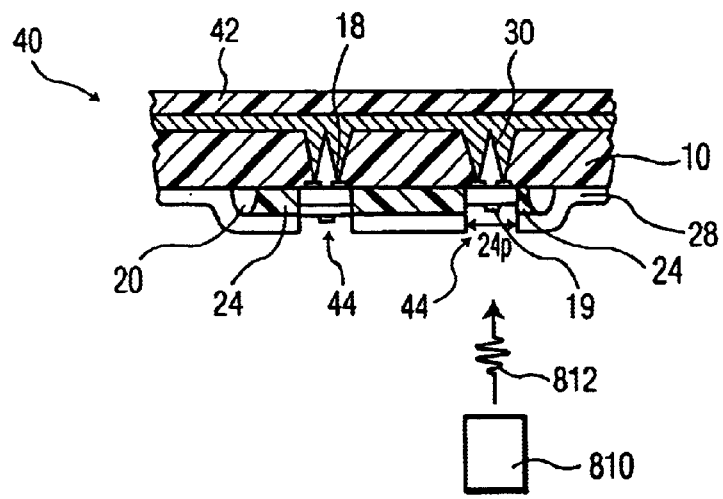
FIG. 8 is a cross sectional view of FIG. 7a illustrating the ablation of a selected area of the parylene coating.

According to an aspect of the invention, upon completion of the various HDI interconnect layers, a portion of the layer 28 of parylene is selectively ablated (vaporized), as illustrated in FIG. 8. A KrF (Krypton fluoride) excimer laser 810 ablates the layer 28 of parylene without adversely affecting the metallization or surrounding areas. A KrF excimer laser 810 generates tunable light 812 at about 248 nm to break the bonds of the parylene at the locations to be exposed without adversely affecting surrounding or adjacent areas. Other layers, such as a selected portion of the cured encapsulant material 24p, may also be removed in the process to expose the backside connection(s) 19, underlying inputs and outputs, andor ground plane(s) 36. The selective removal of the parylene layer 28 leaves openings 44 through which solder or other thermally or electrically conductive material 38 may flow into the ablated region opening(s) 44.

Figure 9:
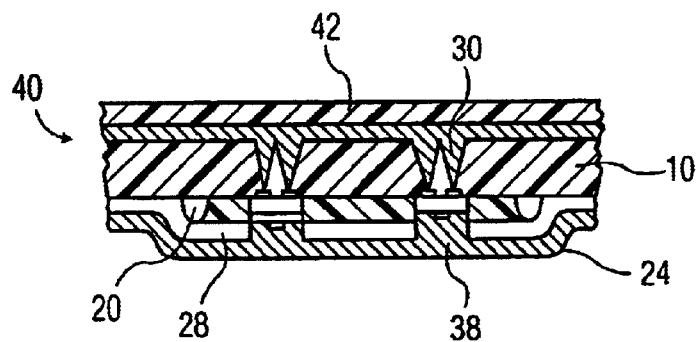
FIG. 9 is a cross sectional view of FIG. 8 illustrating the disposition of a conductive layer.

According to a step of the processing, an electrical connection is made by applying a conductive material 38 to the patterned regions, as illustrated in FIG. 9. The conductive material 38 may be solder in its liquid state, or a conductive epoxy. The parylene layer 28 thus serves as a solder mask, and prevents flow of solder or other conductive material into the portions of the HDI assembly from which the parylene has not been removed.

Figure 10:
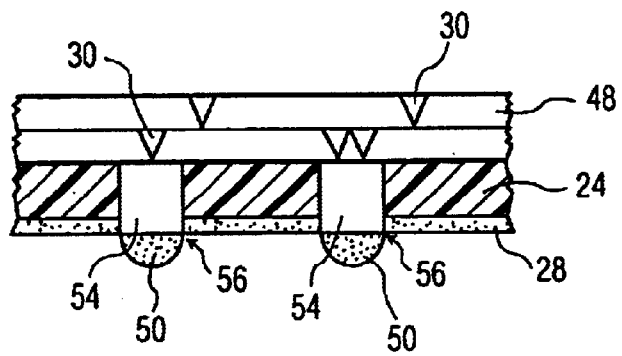
FIG. 10 is a cross sectional view illustrating an alternative embodiment of FIG. 9 according to an aspect of the invention.

FIG. 10 illustrates an alternative embodiment of a ball grid array (BGA) of solder balls 50 disposed on a module. In a ball grid array, the external connections are arranged as an array of conducting pads on the back side of the module. Small balls of solder 50 are attached to the die 54 after the layer 28 of parylene has been ablated in at least a portion of the area above the die 54 on the back side of the module, thereby isolating the electrical connections. The layer 28 of parylene thus serves as a solder mask for back side connections and, in this embodiment, defines BGA pads for integration into a further assembly. FIG. 10 also illustrates additional HDI vias 30 formed through an additional HDI layer 48.

The layer 28 of parylene thus serves a dual purpose by serving as a protective coating to the backside connections of the chips, and then, in its partially ablated state, by serving as a solder mask when backside connections on HDI modules are desired.

Other embodiments of the invention will be apparent to those skilled in the art. For example, the method may be used on a thin film circuits, thick film circuits, and printed circuit board assemblies, or any other kind of circuit requiring a mask.

Thus, a method for making an HDI circuit (40) including backside connections (19) by using parylene as a protective coating (28), includes the steps of: procuring an insulating substrate (10) defining front and rear surfaces (10us, 10rs) and including an active chip (14a, 14b, and 14) essentially coplanar with the insulating substrate, which active chip has electrical connections (18) on a front surface (14fs) facing the rear surface (10rs) of the substrate (10) and which also has at least one of a thermal and electrical connection (19) exposed on a rear surface (14rs) of the chip; applying a parylene coating (28) to the at least one connection (19) on the rear surface (10rs) of the chip (14a, 14b, and 14), to thereby protect the at least one connection (19); performing additional HDI interconnect processing steps (32, 42, 48) on the front surface (10us) of the substrate (10), including at least via forming, patterning, and metal deposition, which in the absence of the parylene coating (28) may adversely affect the at least one connection (19); after the step of performing additional HDI front surface interconnect processing steps (32, 42, 48), selectively removing a portion (44) of the parylene coating (28) in the region of the at least one connection (19) to thereby expose at least a portion of the at least one connection (19) in a selected connection region; and making electrical connection (38) to the at least one connection (19) by application of a conductive material in its liquid state to the selected region, whereby the parylene coating (28) limits the application of the conductive material to the selected region. The step of making electrical connection to the backside electrical connections may be performed by application of solder, or conductive epoxy in its liquid state. The step of selectively removing a portion of the parylene coating is performed by a scanned laser (810), and more particularly, a KrF excimer laser. The parylene coating (28) may include monochloropolyparaxylylene.

What is claimed is:

1. A method for making an HDI circuit including backside connections by using parylene as a protective coating, said method comprising the steps of:

procuring an insulating substrate defining front and rear surfaces and including an active chip essentially coplanar with said insulating substrate, which active chip has electrical connections on a front surface of said chip facing said rear surface of said substrate and which also has at least one of a thermal and electrical connection exposed on a rear surface of said chip;

applying a parylene coating to at least one connection on said rear surface of said chip, to thereby protect said at least one connection;

performing additional HDI interconnect processing steps on said front surface of said substrate, including at least via forming, patterning, and metal deposition, which in the absence of said parylene coating may adversely affect said at least one connection;

after said step of performing additional HDI front surface interconnect processing steps, selectively removing a portion of said parylene coating in the region of said at least one connection to thereby expose at least a portion of said at least one connection in a selected connection region; and making electrical connection to said at least one connection by application of a conductive material in its liquid state to said selected region, whereby said parylene coating limits the application of said conductive material to said selected region.

2. The method according to claim 1, wherein said step of making electrical connection to said at least one connection is performed by application of solder in its liquid state.

3. The method according to claim 1, wherein said step of making electrical connection to said at least one connection is performed by application of conductive epoxy in its liquid state.

4. The method according to claim 1, wherein said step of selectively removing a portion of said parylene coating is performed by a scanned laser.

5. The method according to claim 1, wherein said step of selectively removing a portion of said parylene coating is performed by a KrF excimer laser.

6. The method according to claim 1, wherein the parylene coating comprises monochloropolyparaxylylene.

7. A method for making an HDI circuit including backside connections by using parylene as a protective coating, said method comprising the steps of:

procuring an insulating substrate defining front and rear surfaces and including an active chip essentially coplanar with said insulating substrate, which active chip has electrical connections on a front surface of said chip facing said rear surface of said substrate and which also has at least one of a thermal and electrical connection exposed on a rear surface of said chip;

applying a parylene coating to at least one connection on said rear surface of said chip, to thereby protect said at least one connection;

performing additional HDI interconnect processing steps on said front surface of said substrate, which in the absence of said parylene coating may adversely affect said at least one connection;

after said step of performing additional HDI front surface interconnect processing steps, selectively removing a portion of said parylene coating in the region of said at least one connection to thereby expose at least a portion of said at least one connection in a selected connection region; and making electrical connection to said selected region, whereby said parylene coating limits the application of said conductive material to said selected region.

* * * * *